(12) United States Patent
Yamamoto et al.

(10) Patent No.: US 12,300,756 B2
(45) Date of Patent: May 13, 2025

(54) SOLAR CELL, MULTI-JUNCTION SOLAR CELL, SOLAR CELL MODULE, AND PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kazushige Yamamoto, Yokohama Kanagawa (JP); Yukitami Mizuno, Tokyo (JP); Yuya Honishi, Saitama Saitama (JP); Soichiro Shibasaki, Tokyo (JP); Naoyuki Nakagawa, Tokyo (JP); Yasutaka Nishida, Tokyo (JP); Mutsuki Yamazaki, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

(21) Appl. No.: 18/181,607

(22) Filed: Mar. 10, 2023

(65) Prior Publication Data
US 2023/0215965 A1 Jul. 6, 2023

Related U.S. Application Data

(63) Continuation of application No. PCT/JP2021/026048, filed on Jul. 9, 2021.

(51) Int. Cl.
*H01L 31/0687* (2012.01)
*H01L 31/0336* (2006.01)

(52) U.S. Cl.
CPC ...... *H01L 31/0687* (2013.01); *H01L 31/0336* (2013.01)

(58) Field of Classification Search
CPC ............. H01L 31/0687; H01L 31/0336; H01L 25/043; H01L 31/032; H01L 31/0465; H01L 31/072; H02S 20/30
See application file for complete search history.

(56) References Cited

U.S. PATENT DOCUMENTS

2020/0006589 A1* 1/2020 Yamamoto .......... H01L 31/0725
2021/0184066 A1 6/2021 Honishi et al.
(Continued)

FOREIGN PATENT DOCUMENTS

CN 109309136 2/2019
JP 2017-135261 8/2017
(Continued)

OTHER PUBLICATIONS

Tadatsugu Minami "Heterojunction solar cell with 6% efficiency based on an n-type aluminum-gallium-oxide thin film and p-type sodium-doped Cu2O sheet" Applied Physics Express 8, 022301 (2015) (Year: 2015).*

(Continued)

*Primary Examiner* — Michael Y Sun
(74) *Attorney, Agent, or Firm* — Amin, Turocy & Watson, LLP

(57) ABSTRACT

A solar cell according to an embodiment includes a p-electrode, a p-type light-absorbing layer containing a cuprous oxide or/and a complex oxide of cuprous oxides as a main component on the p-electrode, an n-type layer containing an oxide containing Ga on the p-type light-absorbing layer, and an n-electrode. A first region is included between the p-type light-absorbing layer and the n-type layer. The first region is a region from a depth of 2 nm from an interface between the (Continued)

p-type light-absorbing layer and the n-type layer toward the p-type light absorbing layer to a depth of 2 nm from the interface between the p-type light-absorbing layer and the n-type layer toward the n-type layer. Cu, Ga, M1, and O are contained in the first region. M1 is one or more elements selected from the group consisting of Sn, Sb, Ag, Li, Na, K, Cs, Rb, Al, In, Zn, Mg, Si, Ge, N, B, Ti, Hf, Zr, and Ca. A ratio of Cu, Ga, M1, and O is $a1:b1:c1:d1$. $a1$, $b1$, $c1$, and $d1$ satisfy $1.80 \leq a1 \leq 2.20$, $0.005 \leq b1 \leq 0.05$, $0 \leq c1 \leq 0.20$, and $0.60 \leq d1 \leq 1.00$.

20 Claims, 8 Drawing Sheets

(56) References Cited

U.S. PATENT DOCUMENTS

| | | |
|---|---|---|
| 2023/0017543 A1 | 1/2023 | Yamamoto et al. |
| 2023/0125003 A1 | 4/2023 | Nakagawa et al. |

FOREIGN PATENT DOCUMENTS

| | | |
|---|---|---|
| JP | 2018-046196 | 3/2018 |
| JP | 2021-009958 | 1/2021 |
| WO | 2019/146120 | 8/2019 |
| WO | 2022/074851 | 4/2022 |
| WO | 2022/074852 | 4/2022 |

OTHER PUBLICATIONS

International Search Report and Written Opinion for International Application No. PCT/JP2021/026048 mailed on Sep. 21, 2021, 8 pgs.
Chua, et al. "Enhancement of the open circuit voltage of Cu2O/Ga2O3 heterojunction solar cells through the mitigation of interfacial recombination" AIP Advances 9, 055203 (2019).
Minami, et al., "Heterojunction solar cell with 6% efficiency based on an n-type aluminum-gallium-oxide thin film and p-type sodium-doped Cu2O sheet" Applied Physics Express 8, 022301 (2015).
Extended European Search Report for European Patent Application No. 21949392.1 dated Jun. 14, 2024.
Lee, et al. "Atomic Layer Deposited Gallium Oxide Buffer Layer Enables 1.2 V Open-Circuit Voltage in Cuprous Oxide Solar Cells", Advanced Materials vol. 26, 2014, pp. 4704-4710.
Minami, et al. "High-Efficiency Cu2O-based Heterojunction Solar Cells Fabricated Using a Ga2O3 Thin Film as N-Type Layer", Applied Physics Express 6 (2013) 044101.

* cited by examiner

|  | Transmittance | Jsc | Voc | FF | Conversion Efficiency |
|---|---|---|---|---|---|
| Example 1 | A | A | A | A | A |
| Example 2 | A | A | A | A | A |
| Example 3 | A | A | A | A | A |
| Example 4 | A | A | B | A | A |
| Example 5 | A | A | A | A | A |
| Example 6 | A | A | A | A | A |
| Example 7 | A | A | A | A | A |
| Example 8 | A | A | A | B | A |
| Example 9 | A | A | A | A | A |
| Comparative Example 1 | B | C | C | C | C |
| Comparative Example 2 | C | B | C | C | C |
| Comparative Example 3 | A | C | C | C | C |
| Comparative Example 4 | C | B | C | C | C |
| Comparative Example 5 | A | B | C | C | C |
| Comparative Example 6 | B | B | C | C | C |
| Comparative Example 7 | C | C | C | C | C |
| Comparative Example 8 | C | C | C | C | C |

Fig. 9

|  | M1 | R1 | R2 | R3 |
|---|---|---|---|---|
| Example 1 | Al,Zn,Sn | 2.0 : 0.011 : 0.07 : 0.88 | 2.0 : 0.00005 : 0.07 : 0.96 | 0.035 : 3.0 : 0.04 : 2.0 |
| Example 2 | Al,Zn,Sn | 2.0 : 0.007 : 0.04 : 0.82 | 2.0 : 0.00220 : 0.04 : 0.95 | 0.015 : 2.9 : 0.02 : 2.0 |
| Example 3 | Zn,Sn | 2.0 : 0.008 : 0.03 : 0.78 | 2.0 : 0.00106 : 0.04 : 0.93 | 0.020 : 3.0 : 0.02 : 2.0 |
| Example 4 | Sn | 2.0 : 0.010 : 0.02 : 0.79 | 2.0 : 0.00002 : 0.02 : 0.96 | 0.025 : 3.0 : 0.01 : 2.0 |
| Example 5 | Si,Al,Zn,Sn | 2.0 : 0.009 : 0.08 : 0.90 | 2.0 : 0.00237 : 0.07 : 0.97 | 0.015 : 2.9 : 0.06 : 2.0 |
| Example 6 | Sn | 2.0 : 0.045 : 0.01 : 0.95 | 2.0 : 0.00584 : 0.02 : 0.96 | 0.010 : 3.0 : 0.01 : 2.0 |
| Example 7 | Al,Zn,Sn | 2.0 : 0.005 : 0.04 : 0.60 | 2.0 : 0.00037 : 0.04 : 0.83 | 0.015 : 3.0 : 0.02 : 2.0 |
| Example 8 | - | 2.0 : 0.012 : 0.00 : 0.98 | 2.0 : 0.00012 : 0.00 : 0.99 | 0.020 : 2.9 : 0.00 : 2.0 |
| Example 9 | Sb,Sn | 2.0 : 0.036 : 0.05 : 0.99 | 2.0 : 0.00379 : 0.05 : 0.99 | 0.020 : 3.0 : 0.03 : 2.0 |
| Comparative Example 1 | Al,Zn,Sn | 2.0 : 0.005 : 0.07 : 1.86 | 2.0 : 0.00161 : 0.06 : 1.21 | 0.010 : 3.0 : 0.03 : 2.0 |
| Comparative Example 2 | Al,Zn,Sn | 2.0 : 0.012 : 0.05 : 0.38 | 2.0 : 0.00001 : 0.04 : 0.85 | 0.040 : 3.0 : 0.01 : 2.0 |
| Comparative Example 3 | Al,Zn,Sn | 2.0 : 0.011 : 0.03 : 1.99 | 2.0 : 0.00275 : 0.03 : 1.30 | 0.005 : 2.9 : 0.01 : 2.0 |
| Comparative Example 4 | Al,Zn,Sn | 2.0 : 0.010 : 0.06 : 0.56 | 2.0 : 0.00228 : 0.06 : 0.79 | 0.050 : 2.9 : 0.03 : 2.0 |
| Comparative Example 5 | Sn | 2.0 : 0.070 : 0.01 : 1.15 | 2.0 : 0.03268 : 0.01 : 1.05 | 0.025 : 3.0 : 0.01 : 2.0 |
| Comparative Example 6 | Al,Zn,Sn | 2.0 : 0.005 : 0.04 : 0.27 | 2.0 : 0.00034 : 0.04 : 0.70 | 0.015 : 2.9 : 0.03 : 2.0 |
| Comparative Example 7 | - | 2.0 : 0.012 : 0.00 : 1.98 | 2.0 : 0.00001 : 0.00 : 1.44 | 0.020 : 2.9 : 0.00 : 2.0 |
| Comparative Example 8 | Sb,Sn | 2.0 : 0.011 : 0.05 : 1.99 | 2.0 : 0.00003 : 0.05 : 1.36 | 0.010 : 3.0 : 0.03 : 2.0 |

Fig. 10A

|  | R4 | Cu Phase | CuO Phase |
|---|---|---|---|
| Example 1 | 2.0 : 0.00000002 : 0.07 : 1.00 | Existence | Existence |
| Example 2 | 2.0 : 0.00000015 : 0.04 : 0.99 | Existence | NON-Existence |
| Example 3 | 2.0 : 0.00000000 : 0.04 : 0.99 | Existence | NON-Existence |
| Example 4 | 2.0 : 0.00000000 : 0.02 : 1.00 | Existence | Existence |
| Example 5 | 2.0 : 0.00000045 : 0.07 : 1.00 | Existence | Existence |
| Example 6 | 2.0 : 0.00000000 : 0.02 : 1.00 | NON-Existence | Existence |
| Example 7 | 2.0 : 0.00000025 : 0.04 : 1.00 | NON-Existence | NON-Existence |
| Example 8 | 2.0 : 0.00000000 : 0.00 : 1.00 | Existence | NON-Existence |
| Example 9 | 2.0 : 0.00000048 : 0.05 : 1.00 | NON-Existence | NON-Existence |
| Comparative Example 1 | 2.0 : 0.00000012 : 0.06 : 1.00 | NON-Existence | Existence |
| Comparative Example 2 | 2.0 : 0.00000007 : 0.04 : 0.99 | Existence | NON-Existence |
| Comparative Example 3 | 2.0 : 0.00000022 : 0.03 : 1.00 | NON-Existence | Existence |
| Comparative Example 4 | 2.0 : 0.00000000 : 0.05 : 1.00 | Existence | NON-Existence |
| Comparative Example 5 | 2.0 : 0.00000115 : 0.02 : 1.00 | NON-Existence | Existence |
| Comparative Example 6 | 2.0 : 0.00000008 : 0.04 : 0.99 | NON-Existence | Existence |
| Comparative Example 7 | 2.0 : 0.00000000 : 0.00 : 1.00 | NON-Existence | Existence |
| Comparative Example 8 | 2.0 : 0.00000038 : 0.04 : 1.00 | NON-Existence | Existence |

Fig. 10B

SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATION

This application is a Continuation application based upon and claims the benefit of priority from International Patent Application No. PCT/JP2021/026048, the International Filing Date of which is Jul. 9, 2021, the entire contents of which are incorporated herein by reference.

FIELD

Present invention relates to a solar cell, a solar cell, a multi-junction solar cell, a solar cell module, and a photovoltaic power generation system.

BACKGROUND

One of new solar cells is a solar cell using a cuprous oxide ($Cu_2O$) for a light-absorbing layer. $Cu_2O$ is a wide-gap semiconductor. Since $Cu_2O$ is a safe and inexpensive material including copper and oxygen abundantly present on the earth, it is expected that a high-efficiency and low-cost solar cell can be realized.

BRIEF DESCRIPTION OF THE DRAWINGS

FIG. 9 is a table related to Examples.

FIG. 10A is a table related to Examples.

FIG. 10B is a table related to Examples.

DETAILED DESCRIPTION

A solar cell of an embodiment includes a p-electrode, a p-type light-absorbing layer containing a cuprous oxide or/and a complex oxide of cuprous oxides as a main component on the p-electrode, an n-type layer containing an oxide containing Ga on the p-type light-absorbing layer, and an n-electrode. A first region is included between the p-type light-absorbing layer and the n-type layer. The first region is a region from a depth of 2 nm from an interface between the p-type light-absorbing layer and the n-type layer toward the n-type layer to a depth of 2 nm from the interface between the p-type light-absorbing layer and the n-type layer toward the p-type light absorbing layer. Cu, Ga, M1, and O are contained in the first region. M1 is one or more elements selected from the group consisting of Sn, Sb, Ag, Li, Na, K, Cs, Rb, Al, In, Zn, Mg, Si, Ge, N, B, Ti, Hf, Zr, and Ca. A ratio of Cu, Ga, M1, and O is a1:b1:c1:d1. a1, b1, c1, and d1 satisfy $1.80 \le a1 \le 2.20$, $0.005 \le b1 \le 0.05$, $0 \le c1 \le 0.20$, and $0.60 \le d1 \le 1.00$.

Hereinafter, an embodiment will be described in detail with reference to the drawings. Unless otherwise specified, values at 25° C. and 1 atm (atmosphere) are shown.

First Embodiment

Figure 1:
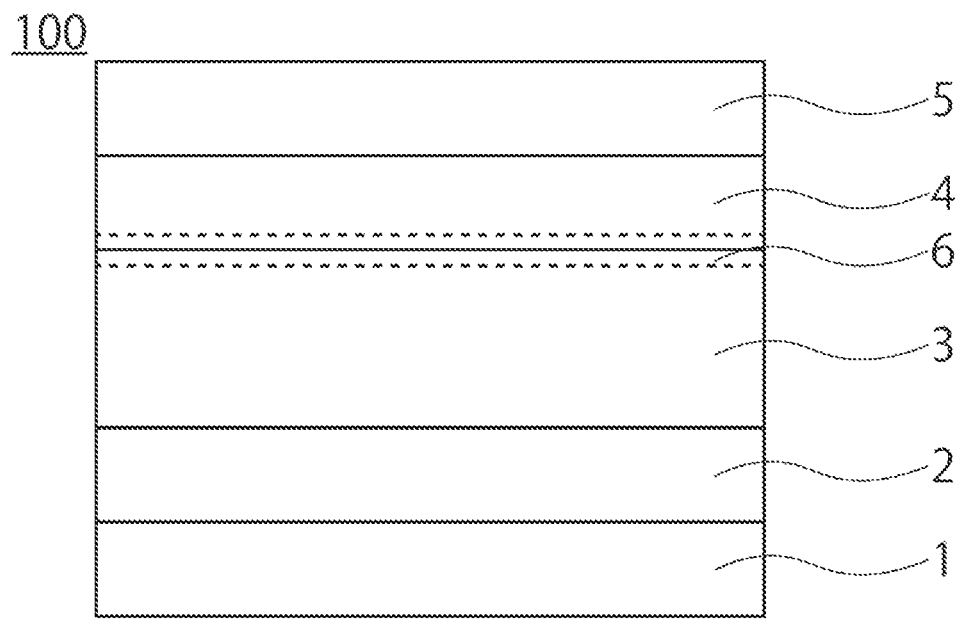
FIG. 1 is a cross-sectional view of a solar cell according to an embodiment.

A first embodiment relates to a solar cell and a method for manufacturing a solar cell. A cross-sectional view of the solar cell according to the first embodiment is illustrated. As Illustrated in FIG. 1, the solar cell 100 according to present embodiment includes a substrate 1, a p-electrode 2 as a first electrode, a p-type light-absorbing layer 3, an n-type layer 4, and an n-electrode 5 as a second electrode. An intermediate layer which is not illustrated may be included between, for example, the n-type layer 4 and the n-electrode 5. Sunlight may be incident from either the n-electrode 5 side or the p-electrode 2 side but is more preferably incident from the n-electrode 5 side. Since the solar cell 100 according to the embodiment is a transmissive solar cell, it is preferable that the solar cell 100 is used as a top cell (light incident side) of a multi-junction solar cell. In FIG. 1, the substrate 1 is provided on a side of the p-electrode 2 opposite to the p-type light-absorbing layer 3 side, but the substrate 1 may be provided on a side of the n-electrode 5 opposite to the n-type layer 4 side. Hereinafter, the embodiment shown in FIG. 1 will be explained, an embodiment whose substrate 1 is provided on the n-electrode 5 side is also the same other than the position of the substrate 1. In the solar cell 100 of the embodiment, light is incident from the n-electrode 5 side toward the p-electrode 2 side.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide, and inorganic substrates such as soda lime glass, white glass, chemically strengthened glass, and quartz can be used as the substrate 1. As the substrate 1, the substrates listed above can be stacked.

The p-electrode 2 is provided on the substrate 1 and is disposed between the substrate 1 and the p-type light-absorbing layer 3. The p-electrode 2 preferably forms an ohmic contact with the p-type-light absorbing layer 3. The p-electrode 2 is a conductive layer having transparency provided on the p-type light-absorbing layer 3 side. A thickness of the p-electrode 2 is typically 100 nm or more and 2,000 nm or less. In FIG. 1, the p-electrode 2 is in direct contact with the light-absorbing layer 3. It is preferable that the p-electrode 2 includes one or more layers of transparent conductive oxide films. As the transparent conductive oxide film, a semiconductor conductive film such as an indium tin oxide (ITO), an Al-doped zinc oxide (AZO), a boron-doped zinc oxide (BZO), a gallium-doped zinc Oxide (GZO), a doped tin oxide, a titanium-doped indium oxide (ITiO), an indium zinc oxide (IZO), an indium gallium zinc oxide (IGZO), a hydrogen-doped indium oxide (IOH), or the like, can be used, and is not particularly limited. The transparent conductive oxide film may be a stacked films having a plurality of films. A dopant for a film of tin oxide or the like is one or more elements selected from the group consisting of In, Si, Ge, Ti, Cu, Sb, Nb, Ta, W, Mo, F, Cl, and the like, and it is not particularly limited. It is preferable that the p-electrode 2 preferably includes a tin oxide film doped with one or more elements selected from the group consisting of In, Si, Ge, Ti, Cu, Sb, Nb, Ta, W, Mo, F, Cl, and the like. In the doped tin oxide film, one or more elements selected from the group consisting of In, Si, Ge, Ti, Cu, Sb, Nb, Ta, W, Mo, F, Cl, and the like are preferably contained at 10 atom % or less with respect to tin contained in the tin oxide film. As the p-electrode 2, a stacked film in which a transparent conductive oxide film and a metal film are stacked can be used. The metal film preferably has a thickness of 1 nm or more and 2 μm or less, and the metal (including alloy) contained in the metal film is Mo, Au, Cu, Ag, Al, Ta, W, or the like, and it is not particularly limited. It is preferable that the p-electrode 2 includes a dot-shaped, line-shaped, or mesh-shaped electrode (one or more selected from the group consisting of metal, an alloy, graphene, a conductive nitride, and a conductive oxide) between the transparent conductive oxide film and the substrate 1 or between the transparent conductive oxide film and the p-type light-absorbing layer 3. It is preferable that the dot-shaped meatal, the line-shaped metal, or the mesh-shaped metal has an aperture ratio of 50% or more with respect to the transparent conductive film. The dot-shape metal, the line-shape metal, or the mesh-like metal is not particularly limited, and is Mo, Au, Cu, Ag, Al, Ta, W, or the like. It is preferable that the dot-shaped, line-shaped, or mesh-shaped metal has an aperture ratio of 50% or more with respect to the transparent conductive oxide film. When the metal film is used for the p-electrode 2, it is preferable that a film thickness is about 5 nm or less from the viewpoint of transparency. When the line-shaped or mesh-shaped metal film is used, since the transparency is obtained owing to the opening, the film thickness of the metal film is not limited thereto.

It is preferable that a doped tin oxide film is provided on an outermost surface of the transparent conductive oxide film on the p-type light-absorbing layer 3 side. It is preferable that at least part of the doped tin oxide film provided on the outermost surface of the transparent conductive oxide film on the p-type light-absorbing layer 3 side is in direct contact with the p-type light-absorbing layer 3.

The p-type light-absorbing layer 3 is a p-type semiconductor layer. The p-type light-absorbing layer 3 may be in direct contact with the p-electrode 2, or other layers may be present as long as the electric contact with the p-electrode 2 can be secured. The p-type light-absorbing layer 3 is disposed between the electrode 2 and the n-type layer 4. The p-type light-absorbing layer 3 is in direct contact with the n-type layer 4. The p-type light-absorbing layer 3 is a semiconductor layer of a metal oxide containing Cu as a main component. The metal oxide containing Cu as the main component is a cuprous oxide or/and a complex oxide of cuprous oxides. It is preferable that the p-type light absorbing layer 3 is polycrystalline of the cuprous oxide or/and the complex oxide of cuprous oxides. The cuprous oxide and/or the complex oxide of cuprous oxides is an oxide whose average composition is represented by $Cu_eM2_fO_g$. The average composition is a composition which is obtained from a mean value of compositions obtained by measuring a plurality of points in the thickness direction and in the planar direction of the p-type light-absorbing layer 3. It is preferable that the M2 is one or more elements selected from the group consisting of Sn, Sb, Ag, Li, Na, K, Cs, Rb, Al, In, Zn, Mg, Ga, Si, Ge, N, B, Ti, Hf, Zr, and Ca. e, f, and g preferably satisfy $1.80 \leq e \leq 2.01$, $0.00 \leq f \leq 0.20$, and $0.98 \leq g \leq 1.02$. 90 wt % or more and 100 wt % or less of the p-type light-absorbing layer 3 is preferably the cuprous oxide or/and the complex oxide of cuprous oxides. 95 wt % or more and 100 wt % of the p-type light-absorbing layer 3 is more preferably the cuprous oxide or/and the complex oxide of cuprous oxides. 98 wt % or more and 100 wt % or less of the p-type light-absorbing layer 3 is still more preferably the cuprous oxide or/and the complex oxide of cuprous oxides. It is preferable that the p-type light-absorbing layer 3 hardly contains Cu or/and CuO which is a heterogeneous phase. Since the p-type light-absorbing layer 3 contains less heterogeneous phases and has good crystallinity, it is preferable that the transmittance of the p-type light-absorbing layer 3 is increased. When the element of M2 is contained in the p-type light-absorbing layer 3, a band gap of the p-type light-absorbing layer 3 can be adjusted. The band gap of the p-type light-absorbing layer 3 is preferably 2.0 eV or more and 2.2 eV or less. When the band gap is in such a range, sunlight can be efficiently used in both a top cell and a bottom cell in the multi-junction solar cell in which the solar cell using Si for the light-absorbing layer is used as the bottom cell and the solar cell of the embodiment is used as the top cell. The p-type light-absorbing layer 3 may further contain Sn or/and Sb. Sn or Sb in the p-type light-absorbing layer 3 may be added to the light-absorbing layer 3 or may be derived from the p-electrode 2. Ga contained in the p-type light-absorbing layer 3 is not included in raw materials for forming the p-type light-absorbing layer 3 and Ga contained in the n-type layer 4 is diffused into p-type light-absorbing layer 3. When other elements are used for forming the n-type layer 4, these elements may be diffused into the p-type light-absorbing layer 3.

The above composition ratio of the p-type light-absorbing layer 3 is the whole of the composition ratio of the p-type light absorbing layer 3. It is preferable that the above composition ratio of the compound of the p-type light-absorbing layer 3 satisfies entirely in the p-type light-absorbing layer 3. When the concentration of Sn and Sb is high in the p-type light-absorbing layer 3, carrier recombination is increased owing to increasing of defects. Therefore, it is preferable that a total volume concentration of the Sb and Sn in the p-type light-absorbing layer 3 is $1.5 \times 10^{19}$ atoms/cm$^3$ or less.

Figure 2:
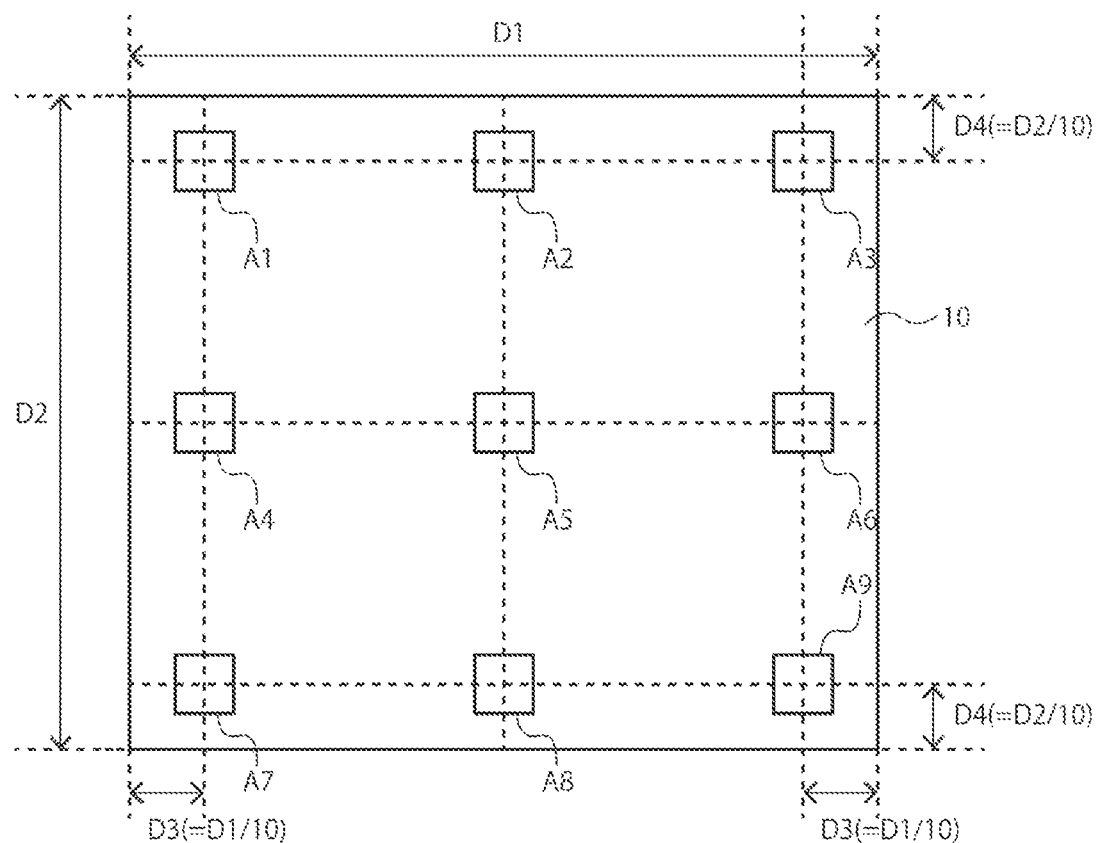
FIG. 2 is a diagram illustrating analysis spots of a solar cell according to an embodiment.

When a thickness of the p-type light-absorbing layer 3 is $d_3$, the composition of the p-type light-absorbing layer 3 is an average value of the compositions at depths of $0.2d_3$, $0.5d_3$, and $0.8d_3$ from a surface of the p-type light absorbing layer 3 on the p-electrode 2 side. Unless there is a condition that an elemental composition ratio of the compound of the p-type light-absorbing layer 3 is inclined, the p-type light-absorbing layer preferably satisfies the above compositions and the following suitable compositions at each depth. In the analysis, analysis spots (A1~A9) distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. When the p-type light absorbing layer 3 is analyzed, D1 is a length of the p-type light-absorbing layer 3 in a width direction, and D2 is a length of the p-type light-absorbing layer 3 in a depth direction.

A thickness of the p-type light-absorbing layer 3 is obtained by cross-sectional observation with an electron microscope or a step profiler, and is preferably 1,000 nm or more and 10,000 nm or less.

Since the p-type light-absorbing layer 3 has the cuprous oxide or/and the complex oxide of cuprous oxides having high crystallinity, crystals constituting the p-type light absorbing layer 3 includes large particles. The p-type light-absorbing layer 3 includes crystals whose diameter (diameter of circumscribed circle) is 80% or more and 100% or less of the thickness of the p-type light-absorbing layer 3. It is preferable that the cross-sectional area of the crystals whose diameter (diameter of circumscribed circle) is 80% or more and 100% or less of the thickness of the p-type light-absorbing layer 3 is 80% or more of the cross-sectional area of the p-type light-absorbing layer 3. The large crystals of the cuprous oxide or/and the complex oxide of cuprous oxides of the p-type-light-absorbing layer 3 has excellent transparency and excellent conversion efficiency, and it contributes to the improvement of conversion efficiency of the solar cell. In addition, existing of the first region 6 and having the large crystals of the cuprous oxide or/and the complex oxide of cuprous oxides of the p-type light-absorbing layer 3 further improves the conversion efficiency.

The p-type light absorbing layer 3 is preferably deposited, for example, by sputtering or the like.

The n-type layer 4 is an n-type semiconductor layer. The n-type layer 4 is located between the p-type light-absorbing layer 3 and the n-electrode 5. The n-type layer 4 is in direct contact with a surface of the p-type light-absorbing layer 3 opposite to the surface which is in contact with the p-electrode 2. The n-type layer 4 which contains an oxide containing Ga as a base may further include other oxide. The n-type layer 4 which contains an oxide containing Ga as a base may be doped with another element. The n-type layer may include mixture of an oxide containing Ga as a base doped with another element and other oxide. The n-type layer 4 is one layer or stacked layers. Ga is included preferably 40% or more of metal elements contained in the n-type layer 4 and more preferably 50% or more of metal elements included in the n-type layer 4. The metal elements included in the n-type layer 4 may be inclined from the p-type absorbing layer 3 side to the n-electrode 5 side.

It is preferable that the n-type layer 4 includes an oxide of an element represented by M3 and Ga. The oxide containing Ga as a main component is, for example, an oxide of the element represented by M3 and Ga. It is preferable that the n-type layer 4 includes an oxide containing Ga and M3 which is one or more elements selected from the group consisting of Sn, Sb, Cu, Ag, Li, Na, K, Cs, Rb, Al, In, Zn, Mg, Si, Ge, N, B, Ti, Hf, Zr, and Ca and Ga. It is preferable that the n-type layer 4 includes 90 wt % or more and 100 wt % or less of the oxide containing Ga and M3 which is one or more elements selected from the group consisting of Sn, Sb, Cu, Ag, Li, Na, K, Cs, Rb, Al, In, Zn, Mg, Si, Ge, N, B, Ti, Hf, Zr, and Ca and Ga. It is preferable that the compound containing Ga as main component is an oxide whose average composition is represented by $Ga_hM3_iO_j$ containing M3 and Ga. h, i, and j preferably satisfy $1.8 \le h \le 2.1$, $0 \le i \le 0.2$, and $2.9 \le j \le 3.1$.

It is preferable that 90 wt % or more and 100 wt % or less of the n-type layer 4 is the oxide containing M3 and Ga. It is more preferable that 95 wt % or more and 100 wt % or less of the n-type layer 4 is the oxide containing M3 and Ga. It is still more preferable that 98 wt % or more and 100 wt % or less of the n-type layer 4 is the oxide containing M3 and Ga. Cu contained in the n-type layer 4 is not included in raw materials for forming the n-type layer 4 and Cu contained in the p-type light-absorbing layer 3 is diffused into n-type layer 4. When other elements is used for forming the p-type light-absorbing layer 3, these elements may be diffused into the n-type layer 4.

A film thickness of the n-type layer 4 is typically 3 nm or more and 100 nm or less. When the film thickness of the n-type layer 4 is less than 3 nm, a leakage current is generated in a case where coverage of the n-type layer 4 is poor, and characteristics may be deteriorated. When the coverage is good, the film thickness is not limited to the above film thickness. When the film thickness of the n-type layer 4 exceeds 50 nm, characteristics may be deteriorated due to an excessive increase in resistance of the n-type layer, or a short-circuit current may be reduced due to a decrease in transmittance. Accordingly, the film thickness of the n-type layer 4 is more preferably 3 nm or more and 20 nm or less and still more preferably 5 nm or more and 20 nm or less.

A composition of the compound of the n-type layer 4 is an average composition of the whole of the n-type layer 4 unless otherwise specified. When a thickness of the n-type layer 4 is $d_4$, the composition of the n-type layer 4 is an average value of the compositions at depths of $0.2d_4$, $0.5d_4$, and $0.8d_4$ from a surface of the n-type layer 4 on the p-type light-absorbing layer 3 side. Unless there is a condition that an elemental composition ratio of the compound of the n-type layer 3 is inclined, the n-type layer 4 preferably satisfies the above compositions and the following suitable compositions at each depth. When the n-type layer 4 is very thin (for example, 5 nm or less), the composition at a depth of 0.5d from the surface of the n-type layer 4 on the p-type light-absorbing layer 3 side can be regarded as the composition of the whole of the n-type layer 4. In the analysis, analysis spots (A1~A9) distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. D1 is a length of the n-type layer 4 in a width direction, and D2 is a length of the n-type layer 4 in a depth direction.

Increasing power generation efficiency for general solar cells such as Si type, the n-type layer 4 decreasing the difference between the conduction band minimum of the p-type light-absorbing layer 3 and the conduction band minimum of the n-type layer 4 and making the speed of recombination being about 10 cm/sec or less is preferable. The inventors researched and discovered that the generation efficiency of the solar cell using the cuprous oxide (the complex oxide) as a light-absorbing layer is improved when the difference of the conduction band minimum is somewhat large and the speed of recombination is fast that is opposite case that the difference of the conduction band minimum is small and the speed of the recombination is slow. The difference between the conduction band minimum of the p-type light-absorbing layer 3 and the conduction band minimum of the n-type layer 4 ([conduction band minimum of p-type light-absorbing layer 3]−[conduction band minimum of n-type layer 4]) is preferably more than 0.5 eV and 1.0 eV or less.

It is preferable that the first region 6 is included between the p-type light-absorbing layer 3 and the n-type layer 4. The first region 6 is a transition region between the p-type light-absorbing layer 3 and the n-type layer 4. The first region 6 includes heterogenous phases of the cuprous oxide and the complex oxide of cuprous oxides which is defects in the junction area between the p-type light-absorbing layer 3 and the n-type layer 4. The first region 6 includes Cu, Ga, element of M1, and oxygen.

The first region 6 is a region from a depth of 2 nm (first point) from the interface between the p-type light-absorbing layer 3 and the n-type layer 4 toward the n-type layer 4 to a depth of 2 nm (second point) from the interface between the p-type light-absorbing layer 3 and the n-type layer 4 toward the p-type light absorbing layer 3. When defects exist in a narrow region of 4 nm thickness in the solar cell having $Cu_2O$ as the p-type light-absorbing layer 3, the recombination speed increases, and the power generation efficiency is improved. When a region where the heterogenous phases which are defects in the junction area between the p-type light-absorbing layer 3 and the n-type layer exist is thick such as 10 nm, the conversion efficiency is greatly decreased. The heterogenous phases which are defect are heterogenous phases with respect to a fourth region of the p type light-absorbing layer 3 and heterogenous phases with respect to a third region of the n-type layer 4.

The interface between the p-type light-absorbing layer 3 and the n-type layer 4 may not be clear. When the interface between the p-type light-absorbing layer 3 and the n-type layer 4 is not clear, the center portion of unclear region is defined as the interface between the p-type light-absorbing layer 3 and the n-type layer 4. The interface between the p-type light-absorbing layer 3 and the n-type layer 4 may be uneven rather than flat. The interface between the p-type light-absorbing layer 3 and the n-type layer 4 can be determined by observing a cross section of the p-type light-absorbing layer 3 and the n-type layer 4. Since the unclear region between the p-type light-absorbing layer 3 contains the heterogenous phases, the thickness of the unclear region between the p-type light-absorbing layer 3 and the n-type layer 4 is preferably 0 nm or more and 10 nm or less, more preferably 1 nm or more and 5 nm or less, and still more preferably 2 nm or more and nm or less in a stacking direction of the p-type light-absorbing layer 3 and the n-type layer 4.

The first region 6 is preferably not islands but layered. When the first region exists in the form of islands, both of a region whose recombination speed is fast and a region whose recombination region is slow should be exist. It is preferable that the layered first region 6 exists between the p-type light-absorbing layer 3 and the n-type layer 4. Existing the layered first region 6 between the p-type light-absorbing layer 3 and the n-type layer 4 means that the first region 6 exists continuously between the p-type light-absorbing layer 3 and the n-type layer 4. Existing the layered first region 6 between the p-type light-absorbing layer 3 and the n-type layer 4 means that there is no area where the first region 6 does not exist between the p-type light-absorbing layer 3 and the n-type layer 4 in the stacking direction of the p-type light-absorbing layer 3 and the n-type layer 4. When the thickness of the first region is less than 2 nm, a region where the recombination speed is fast is likely to exist because the first region 6 is likely to exist in the form of islands.

It is preferably that the first region 6 includes heterogenous phases which are defects in the junction area between the p-type light-absorbing layer 3 and the n-type layer 4. It is preferable that the defects in the junction area between the p-type light-absorbing layer which are heterogenous phases include both of the metal element contained in the p-type light-absorbing layer 3 and the metal element contained in the n-type layer 4. It is preferable that M1 is one or more selected from the group consisting of Sn, Sb, Ag, Li, Na, K, Cs, Rb, Al, In, Zn, Mg, Si, Ge, N, B, Ti, Hf, Zr, and Ca. It is preferable the element of M1 is the element contained as the element of M2 contained in the p-type light-absorbing layer 3 and the element as the element of M3 contained in the n-type layer 4. When the p-type light-absorbing layer 3 contains Ga but not the element of M2 and the n-type layer 4 does not contain the element of M3, the first region 6 does not contain the element of M1. When the p-type light-absorbing layer 3 contains Ga but not the element of M2 and the n-type layer 4 contains the element of M3, the element of M1 of the first region 6 is preferably the element of M3 contained in the n-type layer 4. When the p-type light-absorbing layer 3 contains Ga and the element of M2 and the n-type layer 4 does not contain the element of M3, the element of M1 of the first region 6 is preferably the element of M2 excluding Ga contained in the n-type layer 4.

A ratio of Cu, Ga, M1, and O (Cu:Ga:M1:O) of the first region 6 is a1:b1:c1:$d_1$. a1, b1, c1, and $d_1$ satisfy preferably $1.80 \leq a1 \leq 2.20$, $0.005 \leq b1 \leq 0.05$, $0 \leq c1 \leq 0.20$, and $0.60 \leq d1 \leq 1.00$, more preferably $1.80 \leq a1 \leq 2.05$, $0.005 \leq b1 \leq 0.02$, $0 \leq c1 \leq 0.20$, and $0.60 \leq d1 \leq 0.90$. It is preferable that an average content ratio of an oxide represented by $Cu_eM2_fO_g$ in the first region is 50% or less of the cuprous oxide or/and the complex oxide of cuprous oxides in the p-type light-absorbing layer 3.

A total number of atoms of Cu, Ga, M1, and O contained in the first region 6 is preferably 95 atom % or more and 100 atom % or less and more preferably 98 atom % or more and 100 atom % or less in the first region 6. Elements other than Cu, Ga, M1, and O are inevitable elements such as impurity and atomic concentrations of the inevitable elements in the first region 6 are lower than each atomic concentration of Cu, Ga, and O in the first region 6 of the p-type light-absorbing layer 3.

It is preferable that a thickness of the first region 6 is much thinner than the thickness of the p-type light-absorbing layer 3. Therefore, the thickness of the first region 6 is preferably 0.001% or more and 0.2% or less of the thickness of the p-type light-absorbing layer 3 and more preferably 0.005% or more and 0.1% or less of the thickness of the p-type light-absorbing layer 3. Furthermore, the thickness of the first region 6 is preferably 0.001% or more and 0.2% or less of a total thickness of the p-type light-absorbing layer 3 and the n-type layer 4 and more preferably 0.005% or more and 0.1% or less of the total thickness of the p-type light-absorbing layer 3 and the n-type layer 4.

In the vicinity of the interface between the p-type light-absorbing layer 3 and the n-type layer 4, a portion containing Ga includes the phase which is defects in the junction area between the p-type light-absorbing layer 3 and the n-type layer 4. The element of M2 includes Ga, and phases containing the Ga in the p-type light-absorbing layer 3 (for example, amorphous phases or microcrystals whose diameters of circumscribed circle are 1 nm or less) are heterogenous phases. More specifically, the phases containing Ga are the heterogenous phases containing phases containing Cu, Ga, M1, and O. The p-type light-absorbing layer 3 excluding the first region does not include Ga substantially. Therefore, the phases containing Ga in the p-type light-absorbing layer 3 are heterogenous phases, and the heterogenous phases are locally present in the first region 6.

Furthermore, in the vicinity of the interface between the n-type layer 4 and the p-type light-absorbing layer 3 in the n-type layer 4, a portion containing Cu includes the phase which is defects in the junction area between the p-type light-absorbing layer 3 and the n-type layer 4. The element of M3 includes Cu, and phases containing Cu in the n-type layer 4 (for example, amorphous phases or microcrystals whose diameters of circumscribed circle are 1 nm or less) are heterogenous phases. The heterogenous phases of the p-type light-absorbing layer 3 is also heterogenous phases for the n-type layer 4. More specifically, the phases containing Cu are the heterogenous phases containing phases containing Cu, Ga, M1, and O which are the same as the heterogenous phase of the p-type light-absorbing layer 3. The n-type layer 4 excluding the first region does not include Cu substantially. Therefore, the phases containing Cu in the n-type layer 4 are heterogenous phases, and the heterogenous phases are locally present in the first region 6.

A concentration of Ga in the p-type light-absorbing layer 3 excluding the first region 6 is preferably 0 atom % or more and 0.05 atom % or less of metal elements contained in the p-type light-absorbing layer 3 and more preferably 0 atom % or more and 0.00005 atom % or less of metal elements contained in the p-type light-absorbing layer 3. Furthermore, a concentration of Cu in the n-type layer 4 excluding the first region 6 is preferably 0 atom % or more and 10 atom % or less of of metal elements contained in n-type layer 4 and more preferably 0 atom % or more 1 atom % or less of metal elements contained in the n-type layer 4. The concentration of Cu in the n-type layer 4 excluding the first region 6 is 10 times or more of the concentration of Ga in the p-type light-absorbing layer 3 excluding the first region 6. The reason for this is that Cu diffuses into relatively deep region of the n-type layer 4 even if the diffusion distance is short since the thickness of the p-type light-absorbing layer 3 is 10 times or more of the thickness of the n-type layer 4. When a difference between the amount of Cu diffused from the p-type light-absorbing layer 3 and the amount of Ga diffused from the n-type layer 4 is large, it may cause decreasing the characteristics of the p-type light-absorbing layer 3 and/or the n-type layer 4. Therefore, it is preferable that the number of Ga contained Ga atom in the p-type light-absorbing layer 3 excluding the first region is 0.2 times or more and 7 times or less of the number of Cu atom in the n-type layer 4 excluding the first region 6.

The phase containing Cu, Ga, M1, and O is a phase which satisfies $0.65 \leq a/(a+b+c+d) \leq 0.72$, $0.001 \leq b/a \leq 0.01$, $0.005 \leq c/a \leq 0.05$, and $0.27 \leq d/(a+b+c+d) \leq 0.31$ when the ratio of Cu, Ga, M1, and O Cu:Ga:M1:O) is a:b:c:d. Regarding the analysis spots which are explained below, when the first region 6 includes the phase containing Cu, Ga, M1, and O in at least one of the spots, it means that the phase containing Cu, Ga, M1 is included in the first region 6.

The phase containing Cu, Ga, M1, and O in the first phase 6 is included preferably in half (5) or more of the spots and more preferably in all spots. When the phase containing Cu, Ga, M1, and O in the first phase 6 is included in less than half (5) of the spots, that means less than half of the first region 6 includes the phase containing Cu, Ga, M1, and O. When the phase containing Cu, Ga, M1, and O in the first phase 6 is included in half or more of the spots, that means half or more of the first region includes the phase containing Cu, Ga, M1, and O. When the phase containing Cu, Ga, M1, and O in the first phase 6 is included in all of the spots, that means all of the first region 6 includes the phase containing Cu, Ga, M1, and O. Regarding the definition of the existing ratio of the phase containing Cu, Ga, M1, and O, the same definition can be applied to regions other than the first region 6.

The second region is a region from a depth of 5 nm (start point) from the interface between the p-type light-absorbing layer 3 and the n-type layer 4 toward the p-type light-absorbing layer 3 to a depth of 10 nm (end point) from the interface between the p-type light-absorbing layer 3 and the n-type layer 4 toward the p-type light-absorbing layer 3. Then, the ratio of Cu, Ga, M1, and O (Cu:Ga:M1:O) in the second region is $a2:b2:c2:d_2$. a2, b2, c2, and $d_2$ satisfy preferably $1.90 \leq a2 \leq 2.10$, $0.00 \leq b2 \leq 0.01$, $0 \leq c2 \leq 0.20$, and $0.80 \leq d2 \leq 1.00$ and more preferably $1.95 \leq a2 \leq 2.05$, $0 \leq b2 \leq 0.001$, $0 \leq c2 \leq 0.20$, and $0.80 \leq d2 \leq 1.00$. The recombination speed in the vicinity of the interface between the p-type light-absorbing layer 3 and the n-type layer 4 can be improved without increasing the recombination speed in bulk of the p-type light-absorbing layer 3 since the heterogenous phases does not exist substantially on the p-type light-absorbing layer 3 side and the heterogenous phases exist locally in the first region 6 which is extremely narrow. In the second region, it is preferable that the phase containing Cu, Ga, M1, and O exists not the whole of the second region, it is more preferable that the phase containing Cu, Ga, M1, and O does not exist in half or more of the second region, and it is still more preferable that the phase containing Cu, Ga, M1, and O does not included in the second region.

From the above viewpoints, the second region consists preferably of the cuprous oxide or/and the complex oxide of cuprous oxides which do not contain Ga substantially and more preferably of the cuprous oxide or/and the complex oxide of cuprous oxides which do not contain Ga. Therefore, it is preferable to satisfy $0.87 \leq a2/a1 \leq 1.16$, $0 \leq b2/b1 \leq 0.2$, $0 \leq c2/c1 \leq 2$, and $1 \leq d2/d1 \leq 1.33$, and it is more preferable to satisfy $0.96 \leq a2/a1 \leq 1.13$, $0 \leq b2/b1 \leq 0.15$, $0 \leq c2/c1 \leq 1.75$, and $1.25 \leq d2/d1 \leq 1.33$. From the above viewpoints, it is preferable to satisfy $-0.3 \leq (a2-a1) \leq 0.3$, $0 \leq (b1-b2) < b1$, $-0.1 \leq (c1-c2) < c1$, and $-0.2 \leq (d_2-d_1) \leq 0.4$. It is still more preferable to satisfy b2=0.

When the second region consists of the cuprous oxide or/and the complex oxide of cuprous oxides which do not contain Ga substantially, (b2/(a2+b2+c2+d2)) which is Ga ratio of the second region is smaller than (b1/(a1+b1+c1+d1)) which is Ga ratio of the first region 6. Therefore, it is preferable to satisfy (b2/(a2+b2+c2+d2))<(b1/(a1+b1+c1+d1)), it is more preferable to satisfy 10(b2/(a2+b2+c2+d2))<(b1/(a1+b1+c1+d1)), and it is still more preferable to satisfy 50(b2/(a2+b2+c2+d2))<(b1/(a1+b1+c1+d1)).

Confirming of the existence, the composition, and the average content ratio of the phase containing Cu, Ga, M1, and O in the first region 6, the second region, a third region described in below, and the fourth region are examined by analyzing composition with SIMS, Scanning Electron Microscope-Energy Dispersive X-ray Spectrometry (SEM-EDX), Transmission Electron Microscope-Energy Dispersive X-ray Spectrometry (TEM-EDX), or Energy Dispersive X-ray Spectrometry (EDX). In the specification, representation of 0, 0.0, 0.00, and the like mean the elements or the compound (phase) is not included. It is also treated as absent if it is below the limit of detection or below the limit of quantitation.

The third region is a region from a depth of 5 nm (start point) from the interface between the p-type light-absorbing layer 3 and the n-type layer 4 toward the n-type layer 4 to a depth of 10 nm (end point) from the interface between the p-type light-absorbing layer 3 and the n-type layer 4 toward the n-type layer 4. Then, the ratio of Cu, Ga, M1, and O (Cu:Ga:M1:O) in the third region is a3:b3:c3:d3. a3, b3, c3, and $d_3$ satisfy preferably $0 \leq a3 \leq 0.05$, $2.8 \leq b3 \leq 3.2$, $0 \leq c3 \leq 0.4$, and $1.8 \leq d3 \leq 2.2$ and more preferably $0 \leq a3 \leq 0.03$, $2.9 \leq b3 \leq 3.1$, $0 \leq c3 \leq 0.3$, and $1.9 \leq d3 \leq 2.1$. The recombination speed in the vicinity of the interface between the p-type light-absorbing layer 3 and the n-type layer 4 can be improved without increasing an electron trap density in the third region which is bulk of the n-type layer 4 since the heterogenous phases does not exist substantially on the n-type layer 4 side and the heterogenous phases exist locally in the first region 6 which is extremely narrow. In the third region, it is preferable that the phase containing Cu, Ga, M1, and O exists not the whole of the third region, it is more preferable that the phase containing Cu, Ga, M1, and O does not exist in half or more of the third region, and it is still more preferable that the phase containing Cu, Ga, M1, and O does not included in the third region.

It is preferable that the content ratio of Cu in the third region is lower than the content ratio of Cu in the first region. Therefore, it is preferable to satisfy $0.006 \leq a3/a1 \leq 0.02$, $100 \leq b3/b1 \leq 500$, $0.5 \leq c3/c1 \leq 0.8$, and $1.8 \leq d3/d1 \leq 3$, it is more preferable to satisfy $0.1 \leq a3/a1 \leq 0.16$, $200 \leq b3/b1 \leq 450$, $0.5 \leq c3/c1 \leq 0.7$, and $2 \leq d3/d_1 \leq 2.6$. It is still more preferable to satisfy $a3=0$.

When the content ratio of Cu in the third region is lower than the content ratio of Cu in the first region 6, $(a3/(a3+b3+c3+d3))$ which is the content ratio of Cu in the third region is lower than $(a1/(a1+b1+c1+d1))$ the content ratio of Cu in the first region 6. Therefore, it is preferable to satisfy $(a3/(a3+b3+c3+d3))<(a1/(a1+b1+c1+d1))$, it is more preferable to satisfy $10(a3/(a3+b3+c3+d3))<(a1/(a1+b1+c1+d1))$, and it is still more preferable to satisfy $50(a3/(a3+b3+c3+d3))<(a1/(a1+b1+c1+d1))$.

When the content ratio of Cu in the third region is lower than the content ratio of Cu in the first region 6, $(b3/(a3+b3+c3+d3))$ which is the content ratio of Ga in the third region is higher than $(b1/(a1+b1+c1+d1))$ the content ratio of Ga in the first region 6. Therefore, it is preferable to satisfy $(b3/(a3+b3+c3+d3))>(b1/(a1+b1+c1+d1))$, it is more preferable to satisfy $10(b3/(a3+b3+c3+d3))>(b1/(a1+b1+c1+d1))$, and it is still more preferable to satisfy $50(b3/(a3+b3+c3+d3))>(b1/(a1+b1+c1+d1))$.

In the first region 6, Cu phase may be further contained. When the Cu phase is contained in the first region 6, it is preferable that the recombination speed increases in the vicinity of the interface between the p-type light-absorbing layer 3 and the n-type layer 4 due to occurring defects in the interface between the p-type light-absorbing layer 3 and the n-type layer 4. Furthermore, CuO phase may be also contained in the first region 6.

It is preferable that the content ratio of Ga in the whole of the p-type light-absorbing layer 3 is low. The recombination speed in the interface between the p-type light-absorbing layer 3 and the n-type layer 4 can be improved without increasing the recombination speed in the fourth region which is bulk of the p-type light-absorbing layer 3 since the heterogenous phases does not exist substantially on the p-type light-absorbing layer 3 side excluding the first region 6 and the heterogenous phases exist locally in the first region 6 which is extremely narrow. Therefore, when a whole of an atomic concentration of Cu in the p-type light-absorbing layer 3 is $C_{cu}$ and a whole of an atomic concentration of Ga in the p-type light-absorbing layer 3 is $C_{Ga}$, it is preferable to satisfy $0 \leq C_{Ga}/C_{cu} \leq 0.001$, and it is more preferable to satisfy $0 \leq C_{Ga}/C_{cu} \leq 0.000001$.

It is preferable that the content ratio of Cu in n-type layer 4 is very low. Therefore, it is preferable that a ratio of Cu atoms to the metal elements contained in n-type layer is 0.0% or more and 0.1% or less. The recombination speed in the interface between the p-type light-absorbing layer 3 and the n-type layer 4 can be improved without increasing an electron trap density in the third region which is bulk of the n-type layer 4 since the heterogenous phases does not exist substantially on the n-type layer 4 side excluding the first region 6 and the heterogenous phases exist locally in the first region 6 which is extremely narrow.

The fourth region is a region from a depth of 10 nm (start point) from the interface between the p-type light-absorbing layer 3 and the n-type layer 4 toward the p-type light-absorbing layer 3 to a surface of the p-type light-absorbing layer 3 on the p-electrode side. Then, the ratio of Cu, Ga, M1, and O (Cu:Ga:M1:O) in the fourth region is a4:b4:c4:d4. a4, b4, c4, and d4 satisfy preferably $1.8 \leq a4 \leq 2.1$, $0 \leq b4 \leq 0.001$, $0 \leq c4 \leq 0.2$, and $0.9 \leq d4 \leq 1.0$ more preferably $1.8 \leq a4 \leq 2.03$, $0 \leq b4 \leq 0.000001$, $0 \leq c4 \leq 0.2$, and $0.95 \leq d4 \leq 1$. The recombination speed in the interface between the p-type light-absorbing layer 3 and the n-type layer 4 can be improved without increasing the recombination speed in the fourth region which is bulk of the p-type light-absorbing layer 3 since the heterogenous phases does not exist substantially on the p-type light-absorbing layer 3 side excluding the first region 6 and the heterogenous phases exist locally in the first region which is extremely narrow. In the fourth region, it is preferable that the phase containing Cu, Ga, M1, and O exists not the whole of the fourth region, it is more preferable that the phase containing Cu, Ga, M1, and O does not exist in half or more of the second region, and it is still more preferable that the phase containing Cu, Ga, M1, and O does not included. It is preferable that a maximum content ratio of the phase Cu, Ga, M1, and O in the fourth region is 1.0% or less.

The fourth region consists preferably of the cuprous oxide or/and the complex oxide of cuprous oxides which do not contain Ga substantially and more preferably of the cuprous oxide or/and the complex oxide of cuprous oxides which do not contain Ga. Therefore, it is preferable to satisfy $0.82 \leq a4/a1 \leq 1$, $0 \leq b4/b1 \leq 0.02$, $0 \leq c4/c1 \leq 2$, and $1 \leq d4/d1 \leq 1.6$, it is more preferable to satisfy more preferably $0.9 \leq a4/a1 \leq 1$, $0 \leq b4/b1 \leq 0.00005$, $0 \leq c4/c1 \leq 1.9$, and $1.3 \leq d4/d1 \leq 1.5$.

When the fourth region consists of the cuprous oxide or/and the complex oxide of cuprous oxides which do not contain Ga substantially, $(b4/(a4+b4+c4+d4))$ which is Ga ratio of the second region is smaller than $(b1/(a1+b1+c1+d1))$ which is Ga ratio of the first region 6. Therefore, it is preferable to satisfy $(b4/(a4+b4+c4+d4))<(b1/(a1+b1+c1+d1))$, it is more preferable to satisfy $40(b4/(a4+b4+c4+d4))<(b1/(a1+b1+c1+d1))$, and it is still more preferable to satisfy $100(b4/(a4+b4+c4+d_4))<(b1/(a1+b1+c1+d1))$.

In addition, when an average content ratio of the phase containing Cu, Ga, M1, and O in the fourth region is lower than an average content ratio of the phase containing Cu, Ga, M1, and O in the second region, $(b4/(a4+b4+c4+d4))$ which is the content ratio of Ga in the fourth region is lower than $(b2/(a2+b2+c2+d2))$ the content ratio of Ga in the second region. Therefore, it is preferable to satisfy $(b4/(a4+b4+c4+d4)) \leq (b2/(a2+b2+c2+d2))$, it is more preferable to satisfy $5(b4/(a4+b4+c4+d4)) \leq (b2/(a2+b2+c2+d2))$, and it is still more preferable to satisfy $10(b4/(a4+b4+c4+d4)) \leq (b2/(a2+b2+c2+d2))$.

The n-electrode 5 is an electrode on the n-type layer 4 side having transparency to visible light. The n-type layer 4 is sandwiched between the n-electrode 5 and the p-type light-absorbing layer 3. An intermediate layer (not illustrated) can be provided between the n-type layer 4 and the n-electrode 5. It is preferable that a transparent conductive oxide film is used for the n-electrode 5. It is preferable that the transparent conductive oxide film used for the n-electrode 5 is one or more kinds of semiconductor conductive films selected from the group consisting of an indium tin oxide, an aluminum-doped zinc oxide, a boron-doped zinc oxide, a gallium-doped zinc oxide, an indium-doped zinc oxide, a titanium-doped indium oxide, an indium gallium zinc oxide, and a hydrogen-doped indium oxide. A dopant for a film of tin oxide or the like is not particularly limited as long as the dopant is one or more elements selected from the group consisting of In, Si Ge, Ti, Cu, Sb, Nb, Ta, W, Mo, F, Cl, and the like. The n-electrode 5 may include mesh-shaped or line-shaped electrode to reduce the resistance of the transparent conductive oxide film. The mesh-shaped or line-shaped electrode is not limited as long as Mo, Au, Cu, Ag, Al, Ta, or W. Graphene can be also used for the n-electrode 5. It is preferable that the graphene is stacked with Ag nano wires.

A thickness of the n-electrode 5 is obtained by cross-sectional observation with an electron microscope or a step profiler, and is not particularly limited, but is typically 50 nm or more and 2 μm or less.

Then-electrode 5 is preferably deposited, for example, by sputtering or the like.

Second Embodiment

Figure 3:
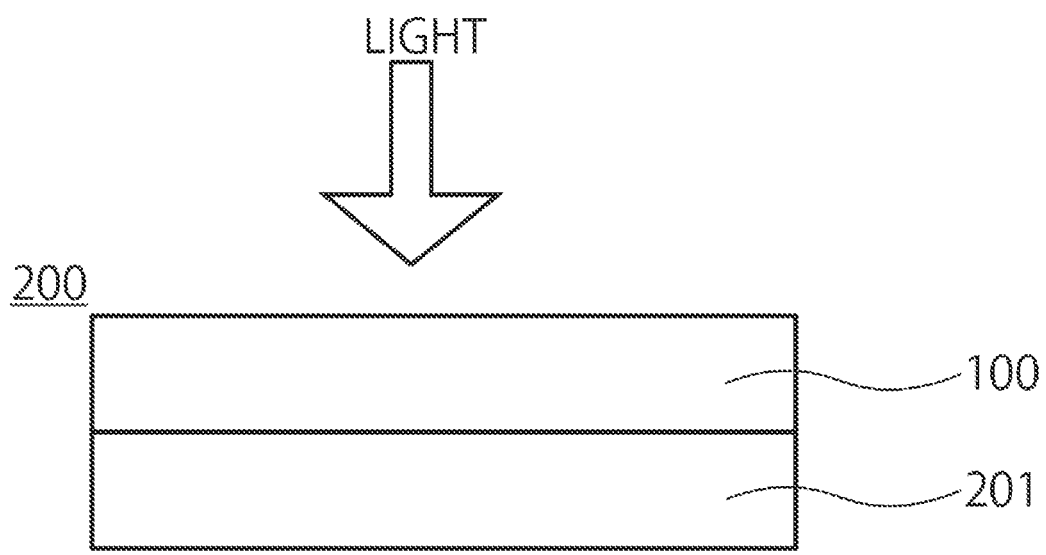
FIG. 3 is a cross-sectional view of a multi-junction solar cell according to an embodiment.

A second embodiment relates to a multi-junction solar cell. FIG. 3 illustrates a conceptual sectional diagram of a multi-junction solar cell according to the second embodiment. The multi-junction solar cell 200 of FIG. 3 includes the solar cell (first solar cell) 100 according to the first embodiment on the light incident side and a second solar cell 201. The band gap of the p-type light-absorbing layer of the second solar cell 201 is smaller than the band gap of the light-absorbing layer 3 of the solar cell 100 according to the first embodiment. Incidentally, the multi-junction solar cell according to the embodiment includes a solar cell in which three or more solar cells are jointed.

The band gap of the p-type light-absorbing layer 3 of the first solar cell 100 according to the first embodiment is about 2.0 eV-2.2 eV, and thus the band gap of the light-absorbing layer of the second solar cell 201 is preferably 1.0 eV or more and 1.6 eV or less. The light-absorbing layer of the second solar cell 201 is preferably selected from the group consisting of any one or more compound semiconductor layers among CIGS-based having a high In content and CdTe-based compound semiconductor layers, crystalline silicon and perovskite type compound.

Third Embodiment

Figure 4:
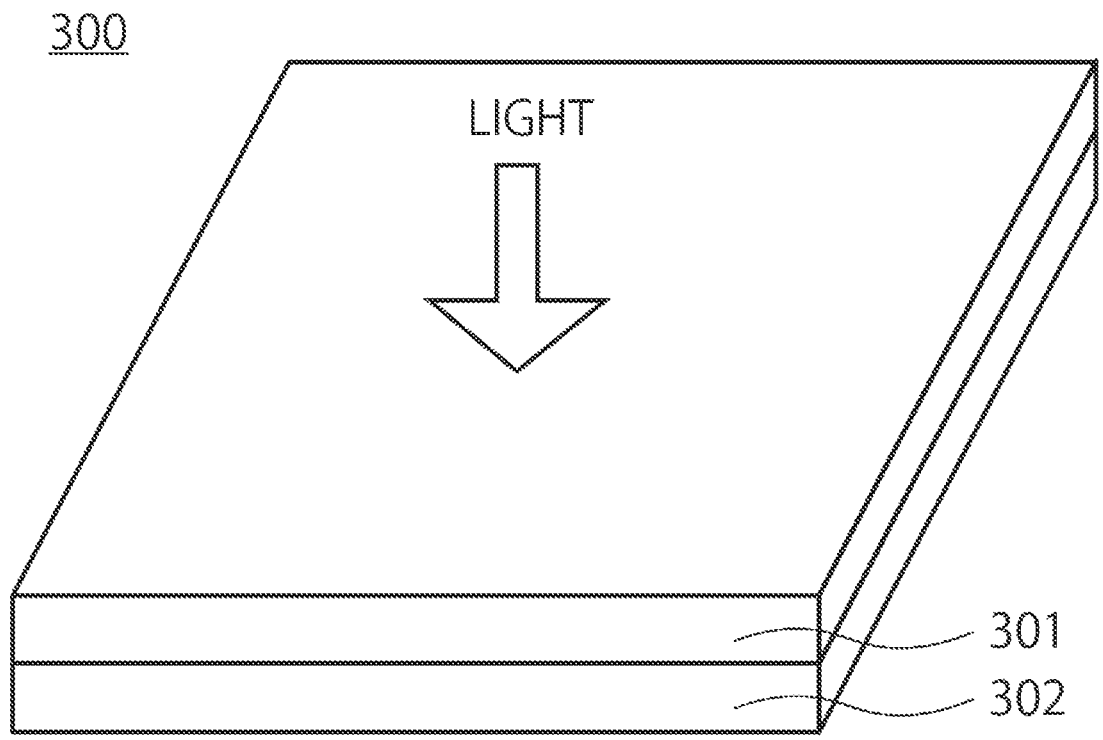
FIG. 4 is a perspective view of a solar cell module according to an embodiment.

A third embodiment relates to a solar cell module. FIG. 4 illustrates a perspective diagram of a solar cell module 300 according to the third embodiment. The solar cell module 300 in FIG. 4 is a solar cell module in which a first solar cell module 301 and a second solar cell module 302 are stacked one on the other. The first solar cell module 301 is on the light incident side and includes the solar cell 100 according to the first embodiment. It is preferable to use the second solar cell 201 in the second solar cell module 302.

Figure 5:
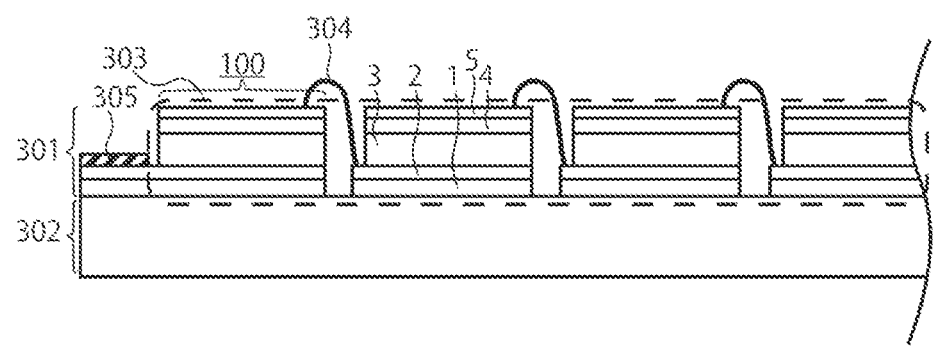
FIG. 5 is a cross-sectional view of a solar cell module according to an embodiment.

FIG. 5 illustrates a sectional diagram of the solar cell module 300. In FIG. 5, the structure of the first solar cell module 301 is illustrated in detail but the structure of the second solar cell module 302 is not illustrated. In the second solar cell module 302, the structure of the solar cell module is appropriately selected depending on the light-absorbing layer of the solar cell to be used. In the solar cell module in FIG. 5, a plurality of submodules 303 in which a plurality of solar cells 100 are arranged in the horizontal direction and electrically connected to each other by a wiring 304 in series and which is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. The solar cell 100 according to the third embodiment includes the substrate 1, the p-electrode 2, the p-type light-absorbing layer 3, n-type layer 4 and the n-electrode as well as the solar cell 100 according to the first embodiment. Both ends of the solar cell 100 in the submodule 303 are connected to the busbar 305, the busbar 305 is preferably configured to electrically connect a plurality of submodules 303 in parallel or in series and adjust the output voltage with the second solar cell module 302. Incidentally, the connection system of the solar cell 100 shown in the third embodiment is an example, the solar cell module can be configured by other connection systems.

Fourth Embodiment

Figure 6:
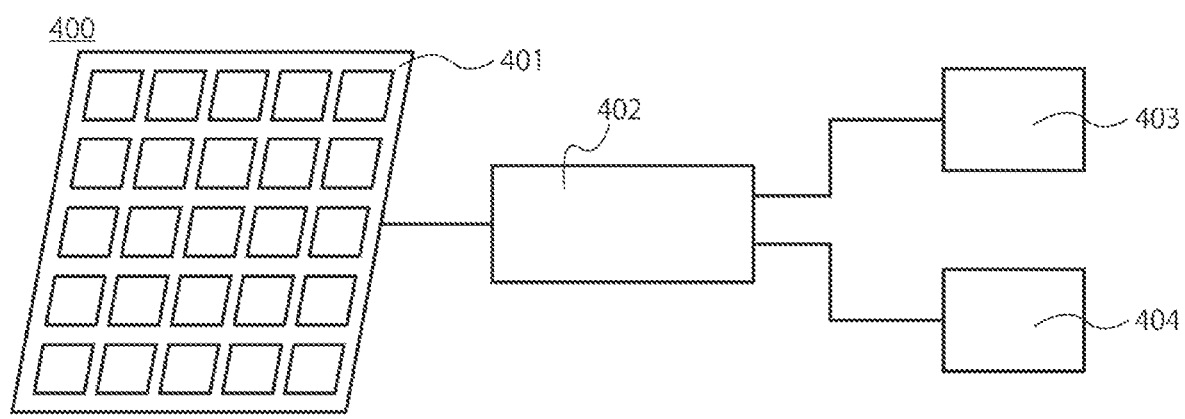
FIG. 6 is a structural view of a photovoltaic power generation system according to an embodiment.

A fourth embodiment relates to a solar photovoltaic power generation system. The solar cell module according to the fourth embodiment can be used as a generator which generates electric power in the solar photovoltaic power generation system according to the fourth embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 6 illustrates a configuration diagram of a solar photovoltaic power generation system 400 according to the embodiment. The solar photovoltaic power generation system in FIG. 6 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the received submodules 303 included in the submodule 300 generate electric power, the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the photoelectric conversion element having an excellent conversion efficiency according to the embodiment is used in the solar cell module 401.

Figure 7:
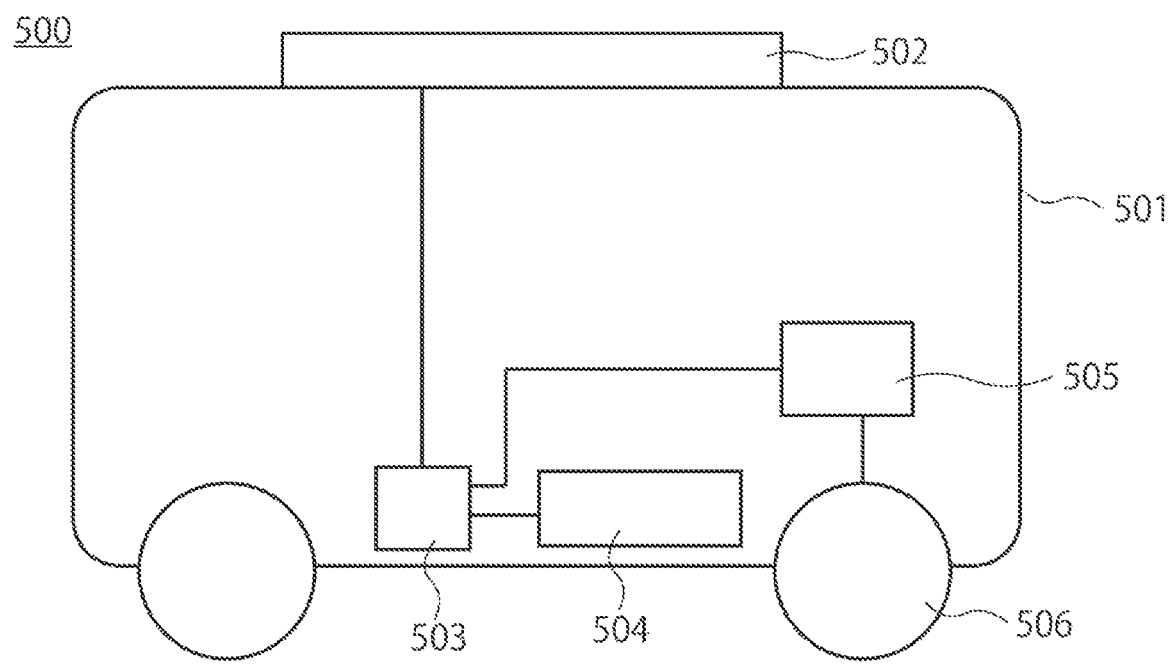
FIG. 7 is a conceptual diagram of a vehicle according to an embodiment.

A vehicle is described as an example of utilization of the solar photovoltaic power generation system 400. FIG. 7 illustrates a conceptual configuration diagram of a vehicle 500. The vehicle 500 in FIG. 7 includes a vehicle body 501, a solar cell module 502, a power converter 503, a storage battery 504, a motor 505, and tires (wheels) 506. The electric power generated by the solar cell module 502 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 502 or the storage battery 504. The solar cell module 502 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501.

Figure 8:
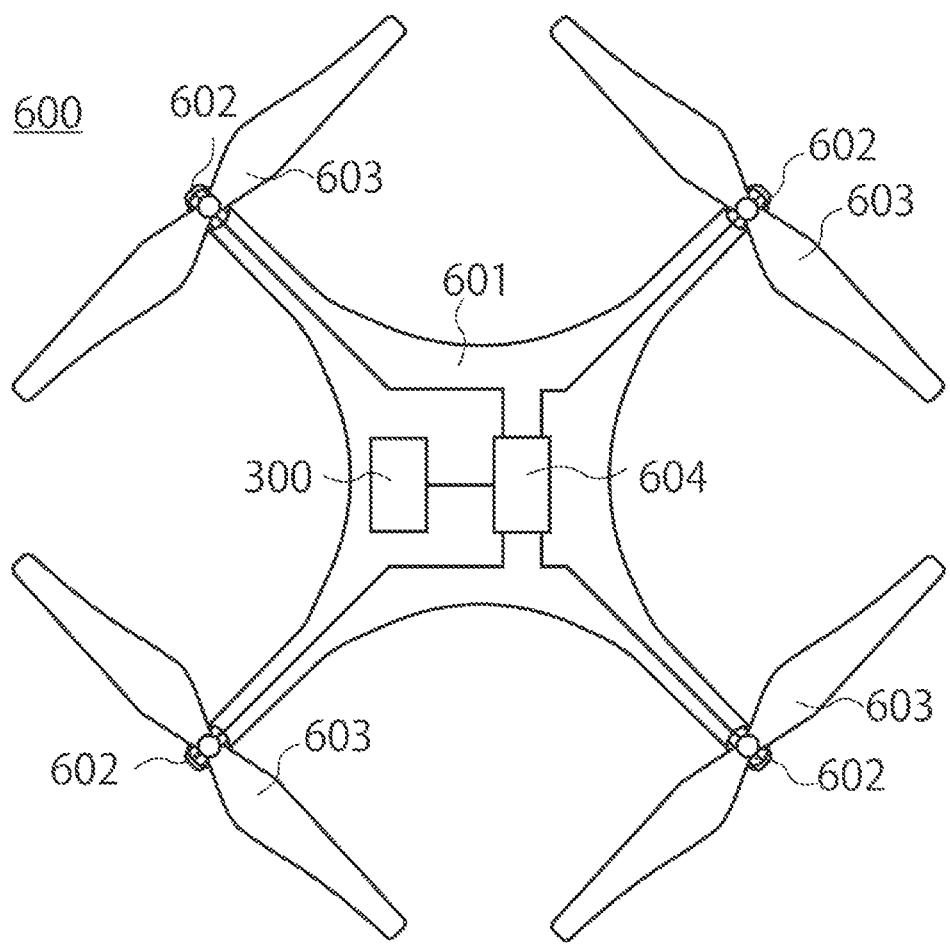
FIG. 8 is conceptual diagram of a flying object according to an embodiment.

A flying object (multi-copter) is described as an example of utilization of the solar photovoltaic power generation system 400. The flying object uses a solar cell module 401. A configuration of the flying object according to the present embodiment will be briefly described using a schematic view of a flying object 600 of FIG. 8. The flying object 600 includes a solar cell module 401, a body frame 601, motors 602, rotary wings 603, and a control unit 604. The solar cell module 300, the motors 602, the rotary wings 603, and the control unit 604 are disposed in the body frame 601. The control unit 604 converts power output from the solar cell module 401 and adjusts output. The motors 602 rotate the rotary wings 603 using the power output from the solar cell module 401. By using the flying object 600 with the present configuration having the solar cell module 401 according to the embodiment, a flying object that can fly using more electric power is provided.

Hereinafter, the present disclosure will be described more specifically based on Examples, but the present disclosure is not limited to the following Examples.

Example 1

ITO (In:Sn=80:20, film thickness 20 nm) and ATO (Sn:Sb=98:2, film thickness: 150 μm) are deposited on an upper surface of a glass substrate on a side in contact with glass as a p-electrode on a back surface side. A $Cu_2O$ light-absorbing layer is formed on a transparent p-electrode by heating at 500° C. by a sputtering method in an oxygen and argon gas atmosphere. Thereafter, the surface of the $Cu_2O$ light-absorbing layer is partly oxidized in an atmosphere containing oxygen at 200° C. Thereafter, by an ALD method, 10 nm of $Ga_{1.92}Al_{0.08}O_{3.00}$ as a n-type layer is deposited, further, 14 nm of $Zn_{0.80}Sn_{0.20}O_{1.2}$ is deposited. Thereafter, a transparent conductive film of AZO as the n-electrode is deposited on the n-type layer. A solar cell is obtained by forming an $MgF_2$ film as an antireflection film. The obtained solar cell is evaluated for a short circuit current (Jsc), an open circuit voltage (Voc), a fill factor (FF), conversion efficiency, and transmittance.

Example 2

A solar cell is manufactured as in Example 1 except that 12 nm of $Ga_{1.95}Al_{0.05}O_{3.00}$ is deposited as a n-type layer instead of $Ga_{1.92}Al_{0.08}O_{3.00}$. The obtained solar cell is evaluated for a short circuit current (Jsc), an open circuit voltage (Voc), a fill factor (FF), conversion efficiency, and transmittance.

Example 3

A solar cell is manufactured as in Example 1 except that 11 nm of $Ga_2O_3$ is deposited as a n-type layer instead of $Ga_{1.92}Al_{0.08}O_{3.00}$. The obtained solar cell is evaluated for a short circuit current (Jsc), an open circuit voltage (Voc), a fill factor (FF), conversion efficiency, and transmittance.

Example 4

A solar cell is manufactured as in Example 1 except that 10 nm of $Ga_2O_3$ is deposited instead of $Ga_{1.92}Al_{0.08}O_{3.00}$ and 12 nm of $Ga_{1.70}Sn_{0.30}O_{3.15}$ instead of $Zn_{0.80}Sn_{0.20}O_{1.2}$ as a n-type layer. The obtained solar cell is evaluated for a short circuit current (Jsc), an open circuit voltage (Voc), a fill factor (FF), conversion efficiency, and transmittance.

Example 5

A solar cell is manufactured as in Example 1 except that $Cu_2O$ light-absorbing layer containing Si is formed. The obtained solar cell is evaluated for a short circuit current (Jsc), an open circuit voltage (Voc), a fill factor (FF), conversion efficiency, and transmittance.

Example 6

A solar cell is manufactured as in Example 1 except that it is heated sequentially at 150° C. after depositing the n-type layer. The obtained solar cell is evaluated for a short circuit current (Jsc), an open circuit voltage (Voc), a fill factor (FF), conversion efficiency, and transmittance.

Example 7

A solar cell is manufactured as in Example 1 except that 10 nm of $Ga_{1.95}Al_{0.05}O_{2.50}$ having oxygen deficiency instead of $Ga_{1.92}Al_{0.08}O_{3.00}$ as a n-type layer and it is heated at 150° C. after depositing $Zn_{0.80}Sn_{0.20}O_{1.2}$. The obtained solar cell is evaluated for a short circuit current (Jsc), an open circuit voltage (Voc), a fill factor (FF), conversion efficiency, and transmittance.

Example 8

A solar cell is manufactured as in Example 1 except that 30 nm of $Ga_2O_3$ is deposited as a n-type layer. The obtained solar cell is evaluated for a short circuit current (Jsc), an open circuit voltage (Voc), a fill factor (FF), conversion efficiency, and transmittance.

Example 9

A solar cell is manufactured as in Example 1 except that $Cu_2O$ light-absorbing layer doped with Sb and Sn on the p-electrode is formed and 30 nm of $Ga_2O_3$ is deposited as a n-type layer. The obtained solar cell is evaluated for a short circuit current (Jsc), an open circuit voltage (Voc), a fill factor (FF), conversion efficiency, and transmittance.

Comparative Example 1

A solar cell is manufactured as in Example 1 except that the surface of the $Cu_2O$ light-absorbing layer is oxidized in an atmosphere containing oxygen at 500° C. The obtained solar cell is evaluated for a short circuit current (Jsc), an open circuit voltage (Voc), a fill factor (FF), conversion efficiency, and transmittance.

Comparative Example 2

A solar cell is manufactured as in Example 1 except that the surface oxidization of the $Cu_2O$ light-absorbing layer is not processed. The obtained solar cell is evaluated for a short circuit current (Jsc), an open circuit voltage (Voc), a fill factor (FF), conversion efficiency, and transmittance.

Comparative Example 3

A solar cell is manufactured as in Example 1 except that the surface of the $Cu_2O$ light-absorbing layer is oxidized in an atmosphere containing hydrogen peroxide at 100° C. The obtained solar cell is evaluated for a short circuit current (Jsc), an open circuit voltage (Voc), a fill factor (FF), conversion efficiency, and transmittance.

Comparative Example 4

A solar cell is manufactured as in Example 1 except that the surface of the $Cu_2O$ light-absorbing layer is oxidized in an atmosphere containing vapor water at room temperature. The obtained solar cell is evaluated for a short circuit current (Jsc), an open circuit voltage (Voc), a fill factor (FF), conversion efficiency, and transmittance.

Comparative Example 5

A solar cell is manufactured as in Example 1 except that it is heated at 400° C. after depositing the n-type layer sequentially. The obtained solar cell is evaluated for a short circuit current (Jsc), an open circuit voltage (Voc), a fill factor (FF), conversion efficiency, and transmittance.

Comparative Example 6

A solar cell is manufactured as in Example 7 except that 10 nm of $Ga_{1.95}Al_{0.05}O_{2.50}$ having oxygen deficiency instead of $Ga_{1.92}Al_{0.08}O_{3.00}$ as a n-type layer and it is heated at 400° C. after depositing $Zn_{0.80}Sn_{0.20}O_{1.2}$. The obtained solar cell is evaluated for a short circuit current (Jsc), an open circuit voltage (Voc), a fill factor (FF), conversion efficiency, and transmittance.

Comparative Example 7

A solar cell is manufactured as in Example 8 except that the surface of the $Cu_2O$ light-absorbing layer is oxidized in an atmosphere containing oxygen at 500° C. The obtained solar cell is evaluated for a short circuit current (Jsc), an open circuit voltage (Voc), a fill factor (FF), conversion efficiency, and transmittance.

Comparative Example 8

A solar cell is manufactured as in Example 9 except that the surface of the $Cu_2O$ light-absorbing layer is oxidized in an atmosphere containing oxygen at 500° C. The obtained solar cell is evaluated for a short circuit current (Jsc), an open circuit voltage (Voc), a fill factor (FF), conversion efficiency, and transmittance.

The amount of light is adjusted to 1 sun by using a solar simulator simulating a light source of AM 1.5G and using a reference Si cell under a light source. A temperature in a measurement room is 25° C. under an atmospheric pressure. A voltage is swept and a current density (current divided by a cell area) is measured. When a horizontal axis represents the voltage and a vertical axis represents the current density, a point intersecting the horizontal axis represents an open circuit voltage Voc, and a point intersecting the vertical axis represents a short circuit current density Jsc. When the voltage and the current density are multiplied on a measurement curve and maximum points are Vmpp and Jmpp (maximum power point), respectively, FF=(Vmpp*Jmpp)/(Voc*Jsc), and a conversion efficiency Eff. is obtained by Eff.=Voc*Jsc*FF.

In the tables of FIG. 9 related to examples, the short-circuit current (Jsc), the open circuit voltage (Voc), fill factor, the conversion efficiency, and the transmittance are shown.

The transmittance is evaluated as A when the transmittance of light in a wavelength band of 700 nm or more and 1200 nm or less is 75% or more, is evaluated as B when the transmittance of light in a wavelength band of 700 nm or more and 1200 nm or less is 70% or more and less than 75%, and is evaluated as C when the transmittance of light in a wavelength band of 700 nm or more and 1200 nm or less is less than 70%.

Jsc is evaluated as A when Jsc is 1.1 times or more of Jsc of Comparative Example 1, is evaluated as B when Jsc is 1.0 times or more and less than 1.1 times of Jsc of Comparative Example 1, and is evaluated as C when Jsc is less than 1.0 times of Jsc of Comparative Example 1.

Voc is evaluated as A when Voc is 1.3 times or more of Voc of Comparative Example 1, is evaluated as B when Voc is 1.0 times or more and less than 1.3 times of Voc of Comparative Example 1, and is evaluated as C when Voc is less than 1.0 times of Voc of Comparative Example 1.

FF is evaluated as A when FF is 1.1 times or more of FF of Comparative Example 1, is evaluated as B when FF is 1.0 times or more and less than 1.1 times of FF of Comparative Example 1, and is evaluated as C when FF is less than 1.0 times of FF of Comparative Example 1.

The conversion efficiency is evaluated as A when the conversion efficiency is 1.5 times or more the conversion efficiency of Comparative Example 1, is evaluated as B when the conversion efficiency is 1.1 times or more and less than 1.5 times the conversion efficiency of Comparative Example 1, and is evaluated as C when the conversion efficiency is less than 1.1 times the conversion efficiency of Comparative Example 1.

Regarding the evaluation of the transmittance, Jsc, Voc, FF, and conversion efficiency of Example 8, the comparison for Example 8 is not Comparative Example 1 but Comparative Example 7. Regarding the evaluation of the transmittance, Jsc, Voc, FF, and conversion efficiency of Example 9, the comparison for Example 9 is not Comparative Example 1 but Comparative Example 8.

In FIG. 10 (FIG. 10A and FIG. 10B), the element of M1 (M1 in the table) of the phase containing Cu, Ga, M1, and O, a1:b1:c1:d1 (R1 in the table) which is ratio of Cu, Ga, M1, and O, a2:b2:c2:d2 (R2 in the table) which is ratio of Cu, Ga, M1, and O in the second region, a3:b3:c3:d3 (R3 in the table) which is ratio of Cu, Ga, M1, and O in the third region, a4:b4:c4:d4 (R4 in the table) which is ratio of Cu, Ga, M1, and O in the fourth region, the existence of Cu phase in the first region (Cu phase in the Table), and the existence of CuO phase in the first region (CuO phase in the Table).

As can be seen tables of FIGS. 9 and 10, since the phases containing Cu, Ga, M1, and O exist locally in the first region, Jsc is increased, and the conversion efficiency of the solar cell is improved. The conversion efficiency of the multi-junction solar cell having the solar cell of examples for top cell and a solar cell having Si as a light-absorbing layer for top cell is improved likewise.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
   a p-electrode;
   a p-type light-absorbing layer containing a cuprous oxide or/and a complex oxide of cuprous oxides as a main component on the p-electrode;
   an n-type layer containing an oxide containing Ga on the p-type light-absorbing layer; and
   an n-electrode, wherein
   a first region is included between the p-type light-absorbing layer and the n-type layer,
   the first region includes a phase containing Cu, Ga, M1, and O,
   the first region is a region from a start point that is a depth of 2 nm from an interface between the p-type light-absorbing layer and the n-type layer toward the p-type light absorbing layer to an end point that is a depth of 2 nm from the interface between the p-type light-absorbing layer and the n-type layer toward the n-type layer,
   Cu, Ga, M1, and O are contained in the first region,
   M1 is one or more elements selected from the group consisting of Sn, Sb, Ag, Li, Na, K, Cs, Rb, Al, In, Zn, Mg, Si, Ge, N, B, Ti, Hf, Zr, and Ca,
   a ratio of Cu, Ga, M1, and O is a1:b1:c1:d1, and
   a1, b1, c1, and d1 satisfy $1.80 \leq a1 \leq 2.20$, $0.005 \leq b1 \leq 0.05$, $0 \leq c1 \leq 0.20$, and $0.60 \leq d1 \leq 1.00$.

2. The solar cell according to claim 1, wherein
   an oxide represented by $Cu_eM2_fO_g$ is contained 90 wt % or more of the p-type light-absorbing layer,
   M2 is one or more elements selected from the group consisting of Sn, Sb, Ag, Li, Na, K, Cs, Rb, Al, In, Zn, Mg, Ga, Si, Ge, N, B, Ti, Hf, Zr, and Ca, and
   e, f, and g satisfy $1.80 \leq e \leq 2.01$, $0.00 \leq f \leq 0.20$, and $0.98 \leq g \leq 1.02$.

3. The solar cell according to claim 1, wherein
   the first region further contains a Cu phase.

4. The solar cell according to claim 1, wherein
   a second region is a region from a depth of 5 nm from the interface between the p-type light-absorbing layer and the n-type layer toward the p-type light-absorbing layer to a depth of 10 nm from the interface between the p-type light-absorbing layer and the n-type layer toward the p-type light-absorbing layer,
   a ratio of Cu, Ga, M1, and O (Cu:Ga:M1:O) in the second region is a2:b2:c2:d2, and
   a2, b2, c2, and d2 satisfy $1.90 \leq a2 \leq 2.10$, $0.00 \leq b2 \leq 0.01$, $0 \leq c2 \leq 0.20$, and $0.80 \leq d2 \leq 1.00$.

5. The solar cell according to claim 1, wherein
   a third region is a region from a depth of 5 nm from the interface between the p-type light-absorbing layer and the n-type layer toward the n-type layer to a depth of 10 nm from the interface between the p-type light-absorbing layer and the n-type layer toward the n-type layer,
   a ratio of Cu, Ga, M1, and O in the third region is a3:b3:c3:d3, and
   a3, b3, c3, and d3 satisfy $0 \leq a3 \leq 0.05$, $2.8 \leq b3 \leq 3.2$, $0 \leq c3 \leq 0.4$, and $1.8 \leq d3 \leq 2.2$.

6. The solar cell according to claim 1, wherein
   the first region further contains a CuO phase.

7. The solar cell according to claim 1, wherein
   the n-type layer contains an oxide containing Ga as a base, and
   Ga is included 40 atom % or more of metal elements contained in the n-type layer.

8. The solar cell according to claim 1, wherein
   the n-type layer contains an oxide containing Ga and M3, M3 is one or more elements selected from the group consisting of Sn, Sb, Cu, Ag, Li, Na, K, Cs, Rb, Al, In, Zn, Mg, Si, Ge, N, B, Ti, Hf, Zr, and Ca and Ga.

9. The solar cell according to claim 1, wherein
   a fourth region is a region from a depth of 10 nm from the interface between the p-type light-absorbing layer and the n-type layer toward the p-type light-absorbing layer to a surface of the p-type light-absorbing layer on the p-electrode side,
   a ratio of Cu, Ga, M1, and O in the fourth region is a4:b4:c4:d4, and
   a4, b4, c4, and d4 satisfy $1.8 \leq a4 \leq 2.1$, $0 \leq b4 \leq 0.001$, $0 \leq c4 \leq 0.2$, and $0.9 \leq d4 \leq 1.0$.

10. The solar cell according to claim 1, wherein
    a second region is a region from a depth of 5 nm from the interface between the p-type light-absorbing layer and the n-type layer toward the p-type light-absorbing layer to a depth of 10 nm from the interface between the p-type light-absorbing layer and the n-type layer toward the p-type light-absorbing layer,
    a ratio of Cu, Ga, M1, and O (Cu:Ga:M1:O) in the second region is a2:b2:c2:d2,
    a2, b2, c2, and d2 satisfy $1.90 \leq a2 \leq 2.10$, $0.00 \leq b2 \leq 0.01$, $0 \leq c2 \leq 0.20$, and $0.80 \leq d2 \leq 1.00$, and
    a1, a2, b1, b2, c1, c2, d1, and d2 satisfy $0.87 \leq a2/a1 \leq 1.16$, $0 \leq b2/b1 \leq 0.2$, $0 \leq c2/c1 \leq 2$, and $1 \leq d2/d1 \leq 1.33$.

11. The solar cell according to claim 1, wherein
    a third region is a region from a depth of 5 nm from the interface between the p-type light-absorbing layer and the n-type layer toward the n-type layer to a depth of 10 nm from the interface between the p-type light-absorbing layer and the n-type layer toward the n-type layer,
    a ratio of Cu, Ga, M1, and O in the third region is a3:b3:c3:d3, and
    a3, b3, c3, and d3 satisfy $0 \leq a3 \leq 0.05$, $2.8 \leq b3 \leq 3.2$, $0 \leq c3 \leq 0.4$, and $1.8 \leq d3 \leq 2.2$, and
    a1, a3, b1, b3, c1, c3, d1, and d3 satisfy $0.006 \leq a3/a1 \leq 0.02$, $100 \leq b3/b1 \leq 500$, $0.5 \leq c3/c1 \leq 0.8$, and $1.8 \leq d3/d1 \leq 3$.

12. The solar cell according to claim 1, wherein
    a fourth region is a region from a depth of 10 nm from the interface between the p-type light-absorbing layer and the n-type layer toward the p-type light-absorbing layer to a surface of the p-type light-absorbing layer on the p-electrode side, a ratio of Cu, Ga, M1, and O in the fourth region is a4:b4:c4:d4, a4, b4, c4, d4 satisfy $1.8 \leq a4 \leq 2.1$, $0 \leq b4 \leq 0.001$, $0 \leq c4 \leq 0.2$, $0.9 \leq d4 \leq 1.0$, and a1, a4, b1, b4, c1, c4, d1, and d4 satisfy $0.82 \leq a4/a1 \leq 1$, $0 \leq b4/b1 \leq 0.02$, $0 \leq c4/c1 \leq 2$, and $1 \leq d4/d1 \leq 1.6$.

13. The solar cell according to claim 1, wherein when a whole of an atomic concentration of Cu in the p-type light-absorbing layer is $C_{Cu}$ and a whole of an atomic concentration of Ga in the p-type light-absorbing layer is $C_{Ga}$, $C_{Cu}$ and $C_{Ga}$ satisfy $0 \leq C_{Ga}/C_{Cu} \leq 0.001$.

14. The solar cell according to claim 1, wherein a fourth region is a region from a depth of 10 nm from the interface between the p-type light-absorbing layer and the n-type layer toward the p-type light-absorbing layer to a surface of the p-type light-absorbing layer on the p-electrode side, a phase containing Cu, Ga, M1, and O in the fourth region is a4:b4:c4:d4, and a maximum content ratio of the phase Cu, Ga, M1, and O in the fourth region is 1.0% or less.

15. The solar cell according to claim 1, wherein the first region is layered, a thickness of the first region is 0.001% or more and 0.2% or less of the thickness of the p-type light-absorbing layer, and a total number of atoms of Cu, Ga, M1, and O contained in the first region is 95 atom % or more and 100 atom % or less.

16. The solar cell according to claim 1, wherein the first region contains a phase containing Cu, Ga, M1, and O, when a ratio of the phase containing Cu, Ga, M1, and O is a:b:c:d, $0.65 \leq a/(a+b+c+d) \leq 0.72$, $0.001 \leq b/a \leq 0.01$, $0.005 \leq c/a \leq 0.05$, $0.27 \leq d/(a+b+c+d) \leq 0.31$ are satisfied, and half or more of the first region includes the phase containing Cu, Ga, M1, and O.

17. The solar cell according to claim 1, wherein

Ga contained in the p-type light-absorbing layer is diffused from the n-type layer, and Cu contained in the n-type layer is diffused from the p-type-light-absorbing layer.

18. A multi-junction solar cell comprising:

the solar cell according to claim 1; and a solar cell including a light-absorbing layer in which a band gap is smaller than a band gap of the p-type light-absorbing layer of the solar cell according to claim 1.

19. A solar cell module using the solar cell according to claim 1.

20. A photovoltaic power generation system that performs photovoltaic power generation by using the solar cell module according to claim 19.

\* \* \* \* \*